(12) United States Patent
Roger et al.

(10) Patent No.: US 11,683,049 B2
(45) Date of Patent: Jun. 20, 2023

(54) HARDWARE DECOMPRESSOR FOR PADDING NON-EQUIDISTANT DATA

(71) Applicant: Infineon Technologies AG, Neubiberg (DE)

(72) Inventors: Andre Roger, Munich (DE); Markus Bichl, Feldkirchen-Westerham (DE); Romain Ygnace, Brunnthal (DE)

(73) Assignee: Infineon Technologies AG, Neubiberg (DE)

( * ) Notice: Subject to any disclaimer, the term of this patent is extended or adjusted under 35 U.S.C. 154(b) by 575 days.

(21) Appl. No.: 16/793,149

(22) Filed: Feb. 18, 2020

(65) Prior Publication Data

US 2021/0258021 A1    Aug. 19, 2021

(51) Int. Cl.
*H03M 7/30*     (2006.01)
*G01S 7/35*     (2006.01)
*G01S 7/295*    (2006.01)

(52) U.S. Cl.
CPC .......... *H03M 7/6005* (2013.01); *G01S 7/295* (2013.01); *G01S 7/352* (2013.01); *G01S 7/356* (2021.05)

(58) Field of Classification Search
None
See application file for complete search history.

(56) References Cited

U.S. PATENT DOCUMENTS

| 2007/0164894 | A1* | 7/2007 | Sherman | G01S 13/9011 |
| | | | | 342/25 F |
| 2015/0346321 | A1* | 12/2015 | Jansen | G01S 7/02 |
| | | | | 342/107 |
| 2018/0045810 | A1* | 2/2018 | Ygnace | G01S 7/288 |
| 2019/0041494 | A1* | 2/2019 | Roger | G01S 13/87 |
| 2022/0107390 | A1* | 4/2022 | Yang | G01S 13/87 |

* cited by examiner

*Primary Examiner* — Whitney Moore
(74) *Attorney, Agent, or Firm* — Banner & Witcoff Ltd.

(57) ABSTRACT

A processor having a hardware decompressor configured to pad a non-equidistant data set, which is data received at irregular time intervals, with one or more of a predefined value, wherein the data is radar or optical sensor data; and a Fourier transform engine configured to receive the padded non-equidistant data set directly and continuously per data set from the hardware decompressor, and to FFT process the received padded non-equidistant data set.

19 Claims, 4 Drawing Sheets

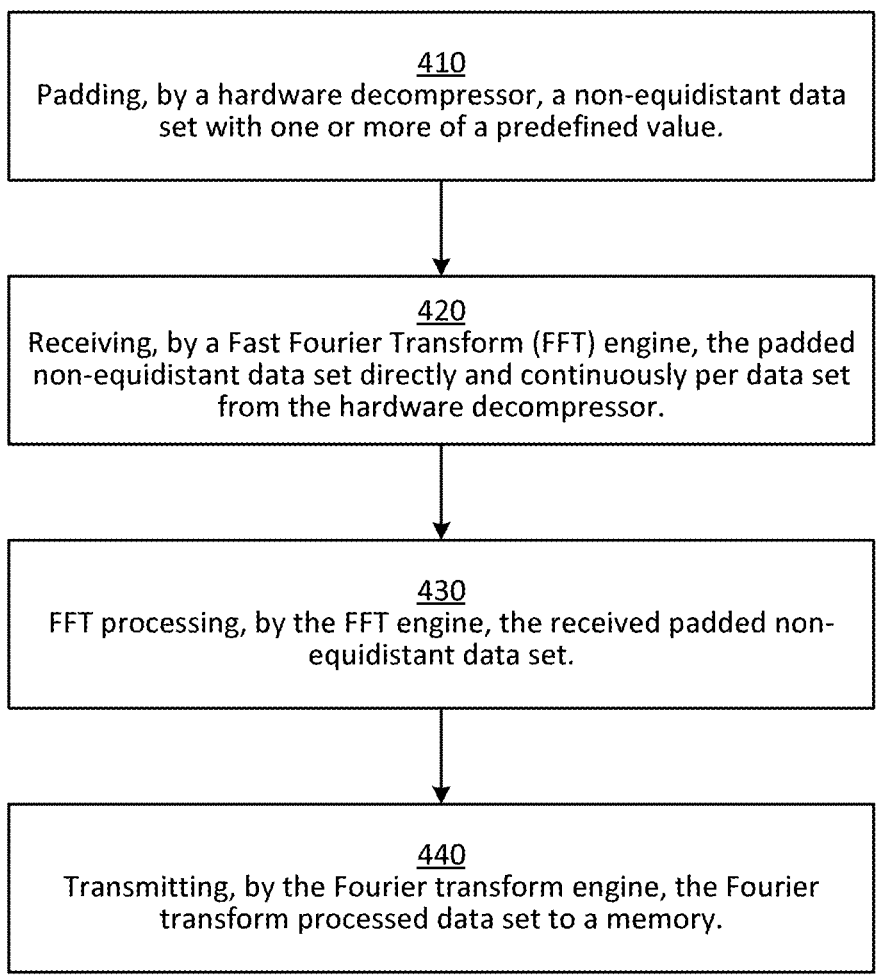

HARDWARE DECOMPRESSOR FOR PADDING NON-EQUIDISTANT DATA

BACKGROUND

A radar system may include a plurality of antennas configured to receive a radar signal. The radar signal is sampled USING an Analog-to-Digital Converter (ADC) to obtain data which is Fast Fourier Transform (FFT) processed to calculate range, velocity, and angle. The range calculation is performed across data samples, the velocity calculation across frequency chirps, and the angle calculation across the plurality of antennas. Radar signal processing is known, and thus for the sake of brevity, further details are omitted here.

Sampled data is non-equidistant if the plurality of antennas are non-equidistantly spaced, or if an ADC has a non-equidistant sampling rate. Straight FFT processing on non-equidistant data will not produce a correct result due to the FFT processing requiring a large number of memory accesses. Also, there is no parallelism BECAUSE FFT processing needs to be performed in advance. One attempt to overcome these drawbacks is to process the sampled data in software, but this requires significant time and memory space.

BRIEF DESCRIPTION OF THE DRAWINGS

FIG. 4 illustrates a flowchart of a processing method in accordance with aspects of the disclosure.

DETAILED DESCRIPTION

The present disclosure is directed to a processor having a hardware decompressor that is coupled directly to a Fourier transform engine and is configured to pad non-equidistant data.

Figure 1:
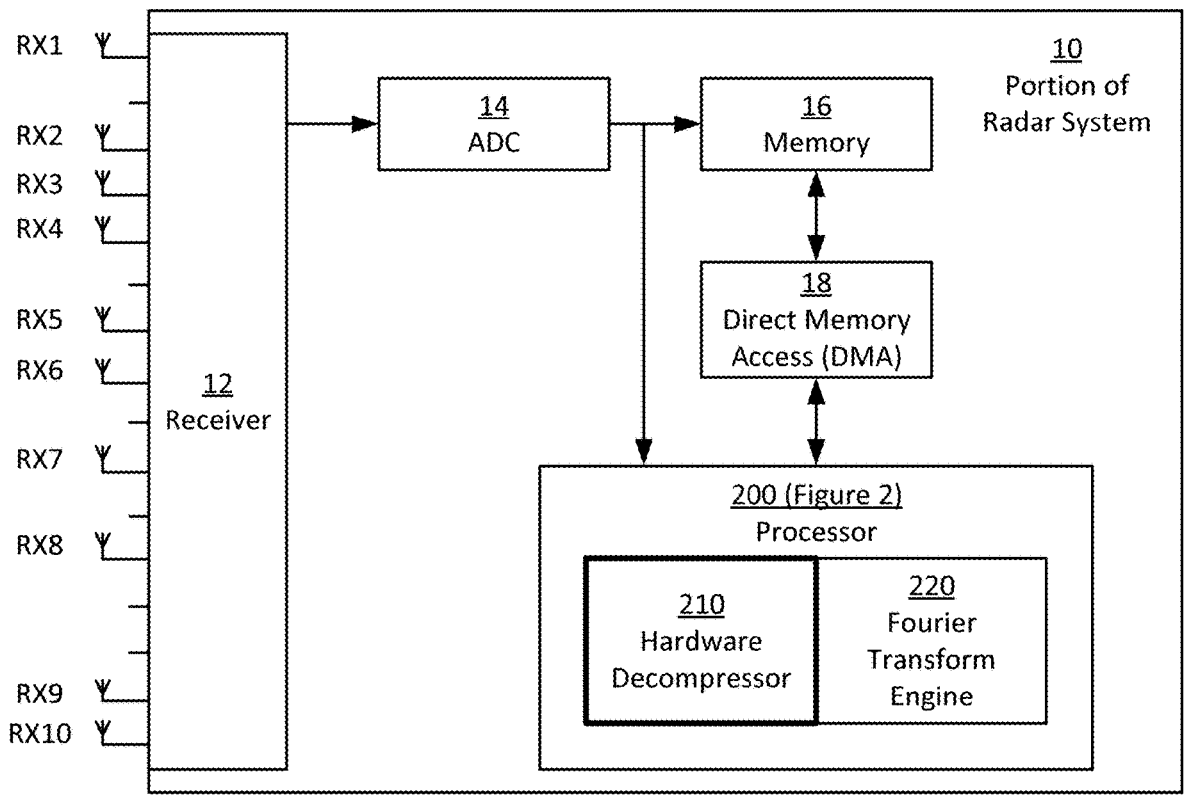
FIG. 1 illustrates a schematic diagram of a portion of a radar system in accordance with aspects of the disclosure.

FIG. 1 illustrates a schematic diagram of a portion of a radar system 10 in accordance with aspects of the disclosure.

The radar system 10 comprises a plurality of antennas RX (RX1 . . . RX10), a receiver 12, an Analog-to-Digital converter (ADC) 14, a memory 16, a Direct Memory Access (DMA) 18, and a processor 200.

The plurality of antennas RX are configured to receive a radar signal carrying radar data. The plurality of antennas RX in this example are not equidistantly-spaced. For example, antennas RX1 and RX2 are physically spaced farther apart from one another than antennas RX2 and RX3. The plurality of antennas Rx not being equidistantly-spaced results in the different antennas Rx receiving the radar signal and the carried data at irregular time intervals, resulting in the data being non-equidistantly spaced.

The receiver 12 is coupled to the plurality of antennas Rx. The receiver 12 is configured to receive from the plurality of antennas Rx the radar signal, and to perform radio frequency front end processing. Receivers and front-end processing is known, and thus for the sake of brevity, further details are omitted here.

The ADC 14 is configured to sample the front-end processed radar signal to obtain digital sets of the non-equidistant data. The ADC 14 sampling the data at a non-equidistant sampling rate would also result in the sampled data being non-equidistantly spaced, whether or not the antennas Rx are non-equidistantly spaced. The ADC 14 is configured to then store the sampled data set or sets in the memory 16, or alternatively, send the sampled data set or sets to the processor 200 directly.

The DMA 18 is configured to access the memory 16 to read the stored data set. The DMA 18 is also configured to access the memory 16 to write data received from the processor.

Figure 2:
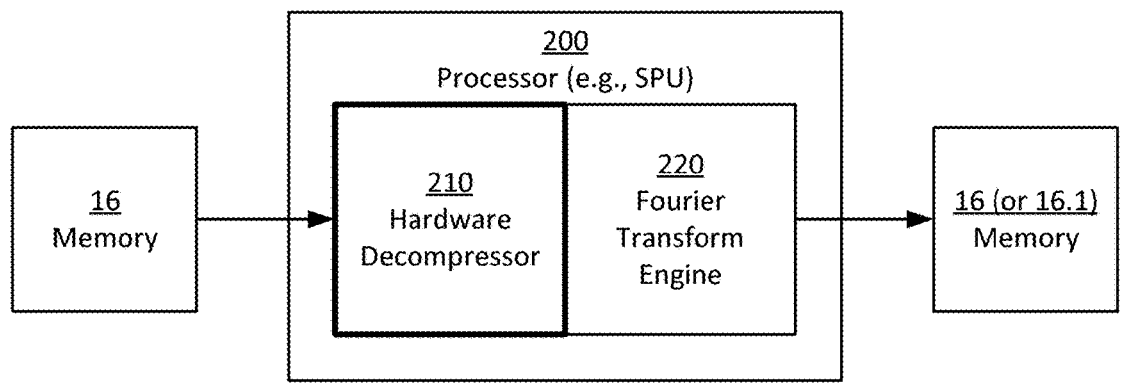
FIG. 2 illustrates a schematic diagram of a processor of FIG. 1 in accordance with aspects of the disclosure.

FIG. 2 illustrates a schematic diagram of the processor 200 of FIG. 1 in accordance with aspects of the disclosure.

The processor 200 comprises a hardware decompressor 210 and a Fourier transform engine 220. The processor 200 may be, for example, a Signal Processing Unit (SPU).

The hardware decompressor 210 receives from the memory 16 the non-equidistant data set. The hardware decompressor 210 is configured to pad the non-equidistant data set with one or more of a predefined value.

The Fourier transform engine 220 is configured to receive the padded non-equidistant data set directly and continuously per data set from the hardware decompressor 210. The Fourier transform engine 220 is also configured to Fourier transform process the received padded non-equidistant data set, and then store the Fourier transform-processed data in the same memory 16, or alternatively, in a different memory 16.1. The Fourier transform process may be a Fast Fourier Transform (FFT) process The hardware decompressor 210 and the Fourier transform engine 220 are configured to pad and Fourier transform process the non-equidistant data set on-the-fly. Since the data is streamed directly from the memory 16 through the hardware decompressor 210 to the Fourier transform engine 220, there is no need to pre-store the data in a buffer. The hardware decompressor 210 may be configured to change positions of data from the order in which the data is stored in the memory 16. The hardware decompressor 210 may alternatively be configured to bypass the Fourier transform engine 220 and transmit the padded data set to a memory 16 or 16.1 for subsequent data analysis, such as off-line simulation.

Figure 3A:
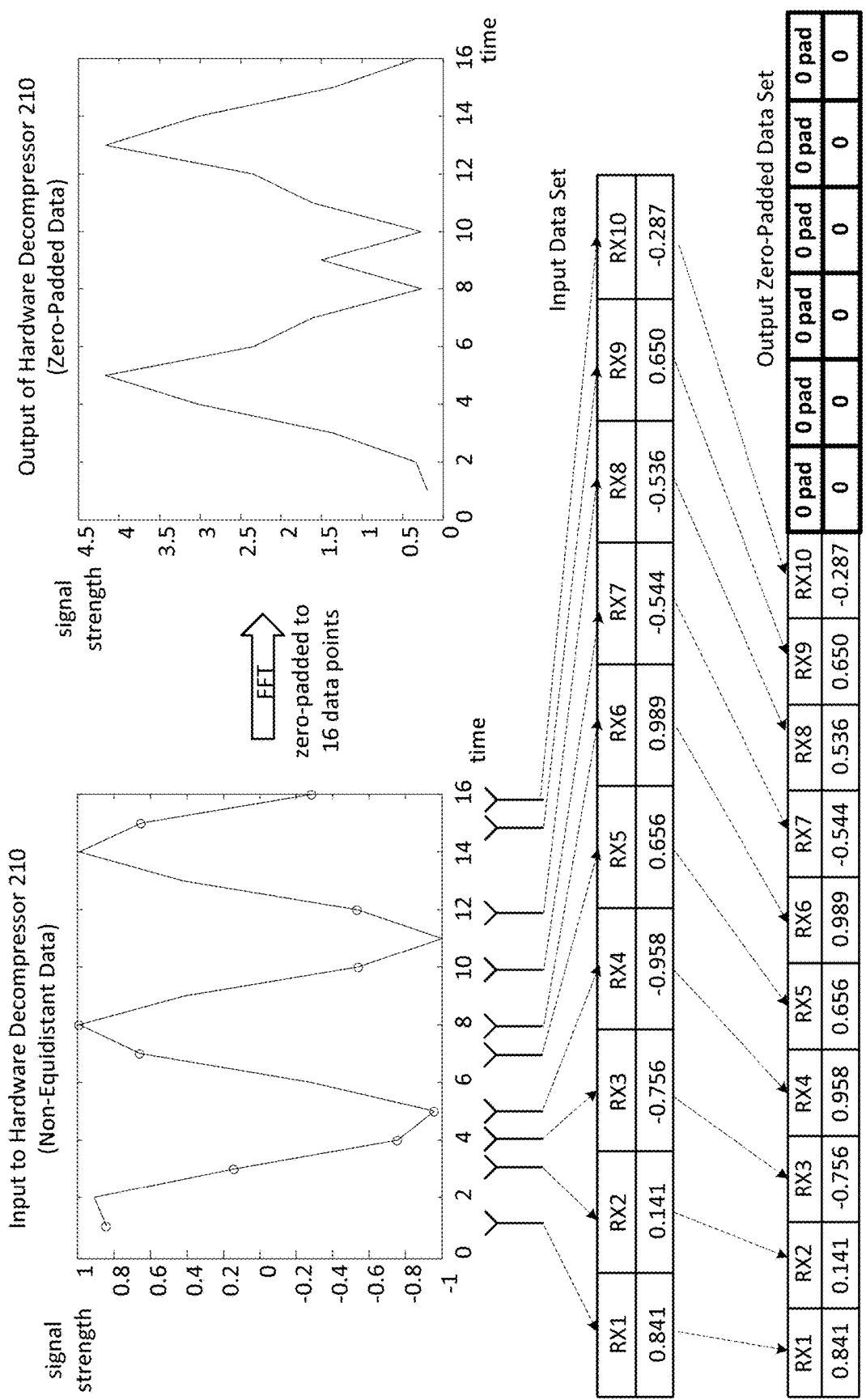
FIGS. 3A and 3B illustrate timing diagrams and data in accordance with aspects of the disclosure.

FIG. 3A illustrates timing diagrams 300A and data in accordance with aspects of the disclosure.

The timing diagrams 300A represent the hardware decompressor 210's input data set and output data set. The hardware decompressor 210's input data set is shown in the timing diagram on the left-hand side, and the output data set is shown in the timing diagram on the right-hand side. In each of these timing diagrams, the x-axis represents time, and the y-axis represents signal strength amplitude.

The hardware decompressor 210 is configured to pad the input non-equidistant data set with one or more of a predefined value, which in this example is zero. The hardware decompressor 210 is configured to pad the input non-equidistant data set with the zeros so that the output non-equidistant data set has a Fourier transform length of the Fourier transform engine 220. In this example, the data set of the input data set has ten non-equidistant data points, represented by circles, and is padded at the end of the data set with six zeros so that the output zero-padded data set has sixteen data points.

An FFT engine usually supports a Fourier transform bit length of 2,048 bits. The number of added zeros in this FFT engine 220 of this example is configurable between (2048−length(input data set)) and 0. For example, if there are ten data sample bits, the hardware decompressor 210 can add up to 2,038 zeros for a total of 2,048 bits. The hardware decompressor 210 may be configured to pad the input non-equidistant data set to a bit length that is to a next power of two as an FFT engine works on power of two data sample sets. For example, if there are four antennas Rx, the hardware decompressor 210 might pad four zeros to obtain an FFT length of 8, maybe up to 16, but usually not much more. Longer FFTs require more computing resources. The data is fed continuously per FFT data set (e.g., 32, 256, 512 . . . depending on the radar configuration).

The hardware decompressor 210 is configured to pad the non-equidistant data set in any of at least three different modes: (1) pad the front of input data set so that all zeros are at the beginning of the output data set; (2) pad the end of input data set such that all zeros are at the end of the data set; and (3) pad according to a bitmask such that zeros are input into the data set according to the bitmask. The bitmask may correspond with missing or error-prone data positions, or with the antenna spacing.

Figure 3B:
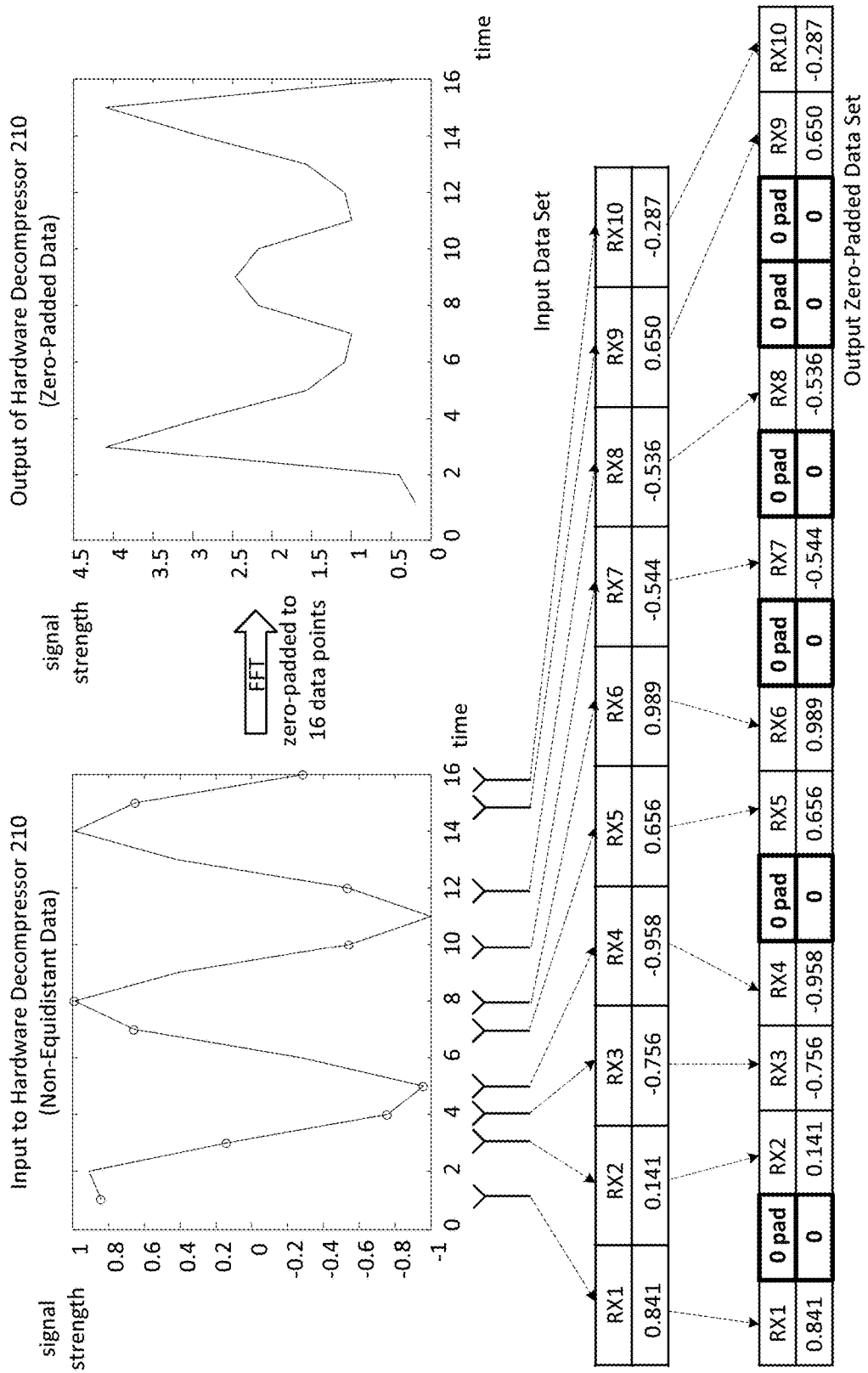

FIG. 3B illustrates the hardware decompressor 210 padding the same input non-equidistant data set as illustrated in FIG. 3A, but instead of padding at the end of the input data set, the padding is in accordance with a bitmask to form a different output zero-padded data set. More specifically, the hardware decompressor 210 may be configured to pad the ten data points of the input non-equidistant data set with zeros at predefined positions corresponding with the spacing of the plurality of antennas Rx. Also or alternatively, the hardware decompressor 210 may be configured to pad the input non-equidistant data set with zeros at positions corresponding with interfered or missing portions of the data set. The interfered or missing portions of the data set may be predetermined or detected on-the-fly. As can be seen, zero-padding in accordance with a bit mask improves the spectrum even further.

FIG. 4 illustrates a flowchart 400 of a processing method in accordance with aspects of the disclosure.

At Step 410, a hardware decompressor 210 pads a non-equidistant data set, which is data received at irregular time intervals, with one or more of a predefined value. The data may be radar or optical sensor data, for example. The padding results in the non-equidistant data set having a Fourier transform length of a Fourier transform engine 220.

At Step 420, the Fourier transform engine 220 receives the padded non-equidistant data set directly and continuously per data set from the hardware decompressor 210.

At Step 430, the Fourier transform engine 220 Fourier transform processes the received padded non-equidistant data set.

At Step 440, the Fourier transform engine 220 transmits the Fourier transform processed data set to a memory 16.

The processor described herein enables efficient FFT processing of non-equidistant data. The data is not limited to being radar data or digital data from an ADC having a non-equidistant sampling rate. The data may alternatively be optical sensor data, or any non-equidistant data.

The techniques of this disclosure may also be described in the following examples.

Example 1. A processor, comprising: a hardware decompressor configured to pad a non-equidistant data set, which is data received at irregular time intervals, with one or more of a predefined value, wherein the data is radar or optical sensor data; and a Fourier transform engine configured to receive the padded non-equidistant data set directly and continuously per data set from the hardware decompressor, and to FFT process the received padded non-equidistant data set.

Example 2. The processor of example 1, wherein the hardware decompressor is configured to pad the non-equidistant data set with the one or more of a predefined value so that the non-equidistant data set has a Fourier transform length of the Fourier transform engine.

Example 3. The processor of example 1, wherein the Fourier transform engine is configured to transmit the Fourier transform processed data set to a memory.

Example 4. The processor of example 1, wherein the hardware decompressor is configured to: bypass the Fourier transform engine and transmit the padded data set to a memory for subsequent data analysis.

Example 5. The processor of example 1, wherein the hardware decompressor and the Fourier transform engine are configured to pad and Fourier transform process the non-equidistant data set on-the-fly.

Example 6. The processor of example 1, wherein the hardware decompressor is configured to pad the non-equidistant data set with the one or more of the predefined value at predefined positions corresponding with a bitmask.

Example 7. The processor of example 6, wherein the bitmask corresponds with missing or error-prone data positions.

Example 8. The processor of example 1, wherein the one or more of the predefined value are padded at the end of the data set.

Example 9. The processor of example 1, wherein the one or more of the predefined value are padded at the beginning of the data set.

Example 10. The processor of example 1, wherein the predefined value is a zero.

Example 11. The processor of example 1, wherein the non-equidistant data set comprises data sampled by an Analog-to-Digital converter (ADC) at a non-equidistant sampling rate.

Example 12. The processor of example 1, wherein the hardware decompressor is configured to pad the non-equidistant data set to a bit length being to a power of two.

Example 13. A radar system, comprising: a plurality of antennas configured to receive a radar signal carrying the non-equidistant data set which includes radar data; and the processor of example 1.

Example 14. The radar system of example 13, wherein the hardware decompressor is configured to pad the non-equidistant data set with the one or more of the predefined value at predefined positions corresponding with positions of the plurality of antennas.

Example 15. The radar system of example 13, wherein the hardware decompressor is configured to pad the non-equidistant data set with the one or more of the predefined value at positions corresponding with interfered or missing portions of the data set.

Example 16. The processor of example 15, wherein the interfered or missing portions of the data set are predetermined.

Example 17. The processor of example 15, wherein the interfered or missing portions of the data set are detected on-the-fly.

Example 18. A processing method, comprising: padding, by a hardware decompressor, a non-equidistant data set, which is data received at irregular time intervals, with one or more of a predefined value, wherein the data is radar or optical sensor data; receiving, by a Fourier transform engine, the padded non-equidistant data set directly and continuously per data set from the hardware decompressor; and Fourier transform processing, by the Fourier transform engine, the received padded non-equidistant data set.

Example 19. The processing method of example 18, wherein the padding by the hardware decompressor results in the non-equidistant data set having a Fourier transform length of the Fourier transform engine.

Example 20. The processing method of example 18, further comprising: transmitting, by the Fourier transform engine, the Fourier transform processed data set to a memory.

While the foregoing has been described in conjunction with exemplary embodiment, it is understood that the term "exemplary" is merely meant as an example, rather than the best or optimal. Accordingly, the disclosure is intended to cover alternatives, modifications and equivalents, which may be included within the scope of the disclosure.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This disclosure is intended to cover any adaptations or variations of the specific embodiments discussed herein.

What is claimed is:

1. A processor, comprising:
   a hardware decompressor configured to pad a non-equidistant data set, which is data received at irregular time intervals, with one or more of a predefined value, wherein the non-equidistance data set is padded to a bit length that is to a power of two, and the data is radar or optical sensor data; and
   a Fourier transform engine configured to receive the padded non-equidistant data set directly and continuously per data set from the hardware decompressor, and to FFT process the received padded non-equidistant data set.

2. The processor of claim 1, wherein the hardware decompressor is configured to pad the non-equidistant data set with the one or more of a predefined value so that the non-equidistant data set has a Fourier transform length of the Fourier transform engine.

3. The processor of claim 1, wherein the Fourier transform engine is configured to transmit the Fourier transform processed data set to a memory.

4. The processor of claim 1, wherein the hardware decompressor is configured to:
   bypass the Fourier transform engine and transmit the padded data set to a memory for subsequent data analysis.

5. The processor of claim 1, wherein the hardware decompressor and the Fourier transform engine are configured to pad and Fourier transform process the non-equidistant data set on-the-fly.

6. The processor of claim 1, wherein the hardware decompressor is configured to pad the non-equidistant data set with the one or more of the predefined value at predefined positions corresponding with a bitmask.

7. The processor of claim 6, wherein the bitmask corresponds with missing or error-prone data positions.

8. The processor of claim 1, wherein the one or more of the predefined value are padded at the end of the data set.

9. The processor of claim 1, wherein the one or more of the predefined value are padded at the beginning of the data set.

10. The processor of claim 1, wherein the predefined value is a zero.

11. The processor of claim 1, wherein the non-equidistant data set comprises data sampled by an Analog-to-Digital converter (ADC) at a non-equidistant sampling rate.

12. A radar system, comprising:
    a plurality of antennas configured to receive a radar signal carrying the non-equidistant data set which includes radar data; and
    the processor of claim 1.

13. The radar system of claim 12, wherein the hardware decompressor is configured to pad the non-equidistant data set with the one or more of the predefined value at predefined positions corresponding with positions of the plurality of antennas.

14. The radar system of claim 12, wherein the hardware decompressor is configured to pad the non-equidistant data set with the one or more of the predefined value at positions corresponding with interfered or missing portions of the data set.

15. The processor of claim 14, wherein the interfered or missing portions of the data set are predetermined.

16. The processor of claim 14, wherein the interfered or missing portions of the data set are detected on-the-fly.

17. A processing method, comprising:
    padding, by a hardware decompressor, a non-equidistant data set, which is data received at irregular time intervals, with one or more of a predefined value, wherein the non-equidistant data set is padded to a bit length that is to a power of two, and the data is radar or optical sensor data;
    receiving, by a Fourier transform engine, the padded non-equidistant data set directly and continuously per data set from the hardware decompressor; and
    Fourier transform processing, by the Fourier transform engine, the received padded non-equidistant data set.

18. The processing method of claim 17, wherein the padding by the hardware decompressor results in the non-equidistant data set having a Fourier transform length of the Fourier transform engine.

19. The processing method of claim 17, further comprising:
    transmitting, by the Fourier transform engine, the Fourier transform processed data set to a memory.

* * * * *